United States Patent [19]

Suzuki et al.

[11] Patent Number: 4,674,238
[45] Date of Patent: Jun. 23, 1987

[54] LEAD FRAME HANDLING APPARATUS FOR BLASTING MACHINE

[75] Inventors: Akira Suzuki; Hidemasa Suzuki; Tomio Yamaguchi, all of Shizuoka, Japan

[73] Assignee: Fuji Seiki Machine Works, Ltd., Shizuoka, Japan

[21] Appl. No.: 810,449

[22] Filed: Dec. 17, 1985

Related U.S. Application Data

[63] Continuation-in-part of Ser. No. 782,841, Oct. 2, 1985, abandoned.

[30] Foreign Application Priority Data

Oct. 3, 1984 [JP] Japan .......................... 59-148934[U]
Jan. 17, 1985 [JP] Japan .............................. 60-004860
Jun. 9, 1985 [JP] Japan .............................. 60-149291

[51] Int. Cl.$^4$ ............................................ B24C 3/08
[52] U.S. Cl. .................................... 51/418; 198/733; 198/735; 198/836; 414/80; 414/32; 414/117; 414/119; 51/417; 51/215 M
[58] Field of Search .............. 51/418 I, 215 E, 215 M, 51/215 R, 216 R, 413, 417; 198/735, 836, 733, 698, 699; 414/80, 32, 82, 117, 118, 119

[56] References Cited

U.S. PATENT DOCUMENTS

| | | | |
|---|---|---|---|
| 3,180,479 | 4/1965 | Meeks et al. | 198/733 |
| 3,874,497 | 4/1975 | Carlson | 198/836 |
| 4,396,332 | 8/1983 | Schmidt et al. | 414/80 |
| 4,555,876 | 12/1985 | Ohtake | 51/418 |
| 4,592,485 | 6/1986 | Anderson | 414/118 |
| 4,592,692 | 6/1986 | Suizu | 414/80 |

Primary Examiner—Frederick R. Schmidt
Assistant Examiner—Bradley I. Vaught
Attorney, Agent, or Firm—Flynn, Thiel, Boutell & Tanis

[57] ABSTRACT

A guiding and transporting arrangement employs opposed guide rails which have longitudinally extending guide structure associated therewith for slidably accommodating a lead frame between the guide rails, which guide rails are slidably supported on transversely extending guide rods, and are drivingly coupled together by a threaded screw arrangement which can be driven to accurately move the guide rails inwardly and outwardly to adjust the spacing therebetween. A conveyor is disposed for cooperation with the guide rails and is disposed below the lead frames to drivingly displace the lead frames longitudinally along the guide rails.

16 Claims, 19 Drawing Figures

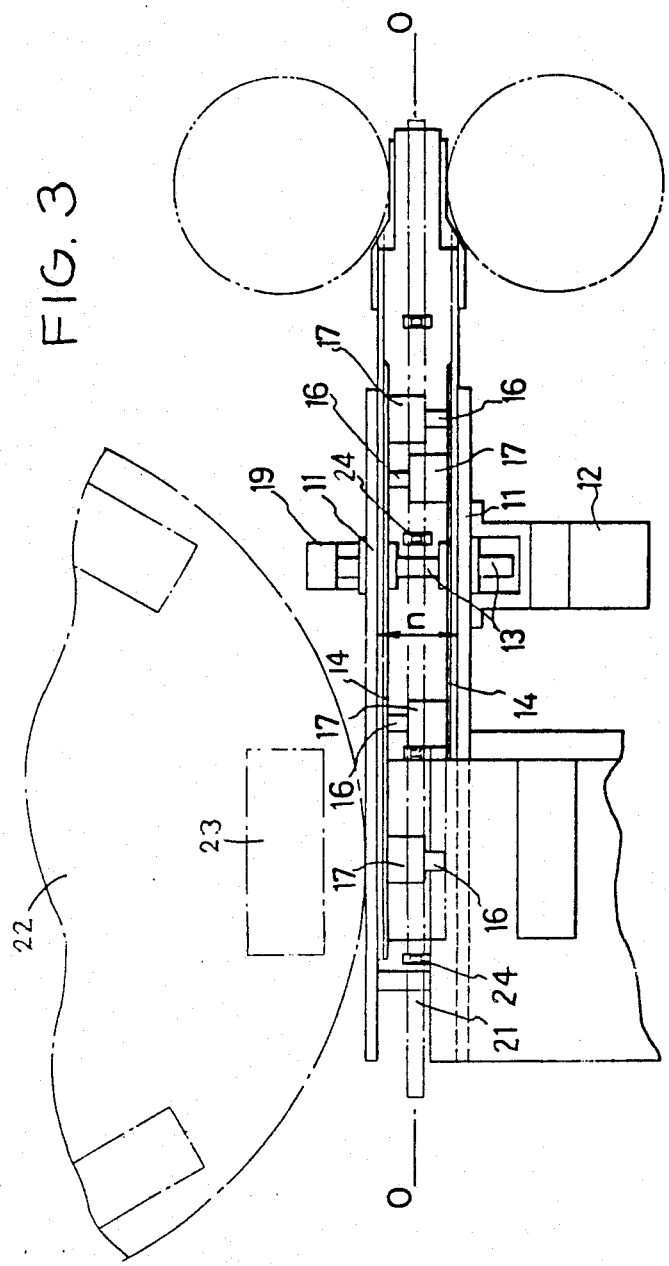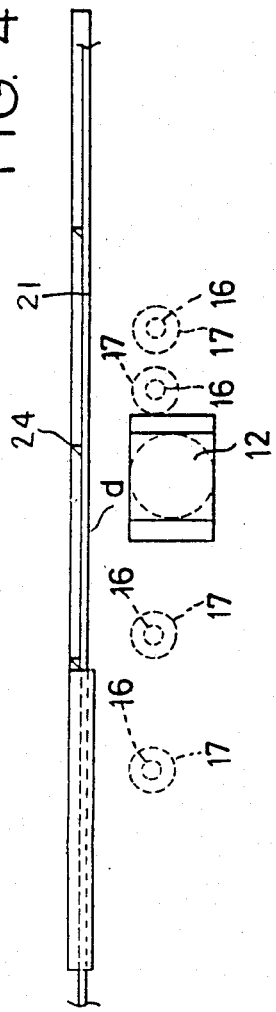

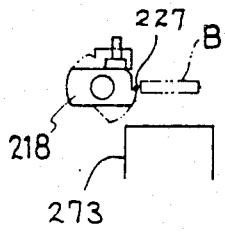
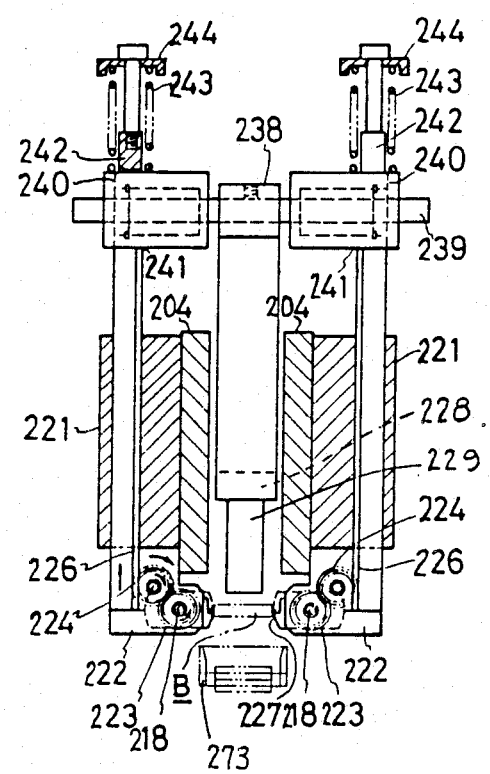
FIG. 18
FIG. 19

LEAD FRAME HANDLING APPARATUS FOR BLASTING MACHINE

This application is a continuation-in-part of copending application Ser. No. 782,841 filed Oct. 2, 1985 now abandoned.

FIELD OF THE INVENTION

This invention relates to an adjustable guide and feeding arrangement for an object such as a lead frame, which arrangement is particularly suitable for feeding lead frames to and away from a blasting chamber.

BACKGROUND OF THE INVENTION

U.S. Pat. No. 4,555,876, as owned by the assignee of this invention, discloses therein an apparatus for handling lead frames so as to permit them to be supplied to and removed from a blasting chamber to effect removal of undesired resin such as flash and burr from around the contacts. In this known apparatus, a plurality of lead frames are stacked within a cassette, and a plurality of cassettes are mounted around the periphery of a rotatable turntable. The lead frames are individually dispensed from one of the cassettes at a predetermined location, with the lead frames being supplied individually and sequentially onto a conveyor which then feeds them into the inlet end of a blasting chamber. The individual lead frames are supported on side-by-side conveyor belts as they are transported through the blasting chamber so as to permit removal of resin burr and flash. The individual lead frames, when leaving the blasting chamber, are then transferred to a removal conveyor which moves the lead frames to a discharge location whereat they are sequentially displaced and loaded into a cassette which is also mounted on a turntable. When the cassette is filled, the turntable is rotated to bring an empty cassette into the loading position so as to permit the operation to continue.

While the apparatus of the aforementioned patent, and variations thereof, has proven to operate in a desirable manner, nevertheless such apparatus possesses features which the assignee considers less than optimum. For example, the individual and sequential transfer of the lead frames from the supply cassette to the input conveyor, and the subsequent individual and sequential transfer of the lead frames from the outlet conveyor to the outlet cassette, involves mechanisms which are relatively complex in view of their structures and motions. Further, this known apparatus can not be readily adjusted to handle lead frames of different size, specifically of different widths. Further, the input and output conveyors associated with the blasting chamber do not always provide for optimum transverse confinement and hence positional control over the lead frames as they are supplied into or moved away from the blasting chamber.

In addition, a difficulty encountered in handling lead frames is the distortion which these units undergo. Since lead frames are very thin, they are easily distorted and this hence makes handling and transferring of such units difficult, and in some instances the handling and transferring of the lead frames increases the distortion such that they can not be satisfactorily used.

Accordingly, it is an object of this invention to provide an improved guiding and feeding device which is particularly suitable for handling lead frames, such as for permitting individual and sequential transporting of such lead frames into and away from a blasting chamber. The arrangement of this invention is particularly desirable in that it permits the use of movement devices and motions which possess greater structural and operational simplicity and at the same time provide more accurate and desirable control over the lead frames being transported. The arrangement also desirably adapts and readily adjusts to changes in the size of the lead frames without requiring extensive reconstruction or shut-down of the apparatus.

The improved guiding and transporting arrangement of this invention employs opposed side rails which have longitudinally extending guide structure associated therewith for slidably accommodating a lead frame between the guide rails, which guide rails are slidably supported on transversely extending guide rods, and are drivingly coupled together by a threaded screw arrangement which can be readily driven so as to accurately and efficiently move the guide rails inwardly and outwardly to adjust the spacing therebetween. A conveyor is disposed for cooperation with the guide rails and is disposed below the lead frames so as to drivingly displace the lead frames longitudinally along the guide rails.

The improved guiding and transporting arrangement of this invention, particularly when used for supplying lead frames to a blasting chamber, additionally has transfer means associated therewith to individually and sequentially supply the lead frames to the guiding device. This transfer means permits individual lead frames to be supplied from a stack into a mechanism which engagingly supports the individual lead frame and then movingly transfers it linearly along a path which is aligned with the guideway so as to effect transfer of the lead frame into the guideway for engagement with the conveyor associated therewith. The transfer mechanism employs a first displacing mechanism which vertically lifts the stack of lead frames so that the uppermost one is disposed between an opposed pair of supporting elements which move transversely inwardly for engaging the uppermost lead frame, with the uppermost lead frame then being slidably displaced linearly into the guideway by a drive unit, such as a reciprocal ram.

A further object of the improved lead frame feeding device of this invention is its ability to handle, and in effect straighten the distorted lead frames so as to minimize the rejection rate of such units following processing thereof.

The improved guideway arrangement of the present invention is also associated with the discharge end of the blasting chamber, which guideway again employs opposed side rails which are slidably and adjustably supported for permitting the spacing therebetween to be readily adjusted to slidably accommodate the desired width of lead frame. There is additionally provided, in association with this guiding arrangement, an appropriate transfer mechanism which individually and sequentially transfers the lead frames transversely relative to the guideway so as to permit further handling thereof, such as the stacking of such lead frames for storage within a cassette.

Other objects and purposes of the invention will be apparent to persons familiar with structures of this general type upon reading the following specification and inspecting the accompanying drawings.

BRIEF DESCRIPTION OF THE DRAWINGS

FIGS. 1-4 illustrate the improved adjustable guideway arrangement for a lead frame according to the present invention wherein:

FIG. 1 is a cross-sectional view of the guideway arrangement;

FIG. 2 is a further cross-sectional view of the guideway arrangement;

FIG. 3 diagrammatically illustrates a plan view of the guideway arrangement, such as for transporting a lead frame toward a blasting chamber;

FIG. 4 is a diagrammatic elevational view illustrating various positional arrangements of the guideway arrangement.

FIGS. 5-12 illustrate a lead frame delivery arrangement according to the invention, which arrangement incorporates therein the adjustable guideway arrangement, and wherein:

FIG. 5 is a perspective view which illustrates the adjustable guideway arrangement;

FIG. 6 is a top plan view which illustrates the feed device and its positional relationship with respect to the input end of a blasting chamber;

FIG. 7 is a plan view which is an enlarged representation of some of the components illustrated in FIG. 6;

FIG. 8 is a side elevational view illustrating various features of the feeding device, this view being taken substantially along the direction of the arrow VIII in FIG. 6;

FIG. 9 is an elevational view partially in section as taken substantially along line IX—IX in FIGS. 6 and 8.

FIGS. 10 and 11 are sectional views taken substantially along lines X—X and XI—XI, respectively, in FIG. 7;

FIG. 12 is an elevational view which illustrates how the cassettes are fed sidewardly into an unloading position beneath the upstream end of the guideway arrangement.

FIGS. 13-19 illustrate a lead frame delivery device for delivering lead frames away from the blasting chamber, which device incorporates therein the adjustable guideway arrangement, and wherein:

FIG. 13 is a fragmentary perspective view illustrating the lead frame delivery device as it projects away from the blasting chamber;

FIG. 14 is a top plan view of the delivery device adjacent the outlet end of the blasting chamber;

FIG. 15 is a side elevational view of the delivery device as taken substantially in the direction of the arrow XV in FIG. 14;

FIG. 16 is an enlarged sectional view as taken substantially along line XVI—XVI in FIG. 14;

FIG. 17 is a fragmentary and partial sectional view showing an enlargement of the structure associated with the discharge end of the delivery device as appearing in FIG. 15;

FIG. 18 is a fragmentary sectional view as taken substantially along line XVIII—XVIII in FIG. 17; and FIG. 19 is a fragmentary view illustrating the holding bars for supporting and dropping the lead frames.

Figure 5:
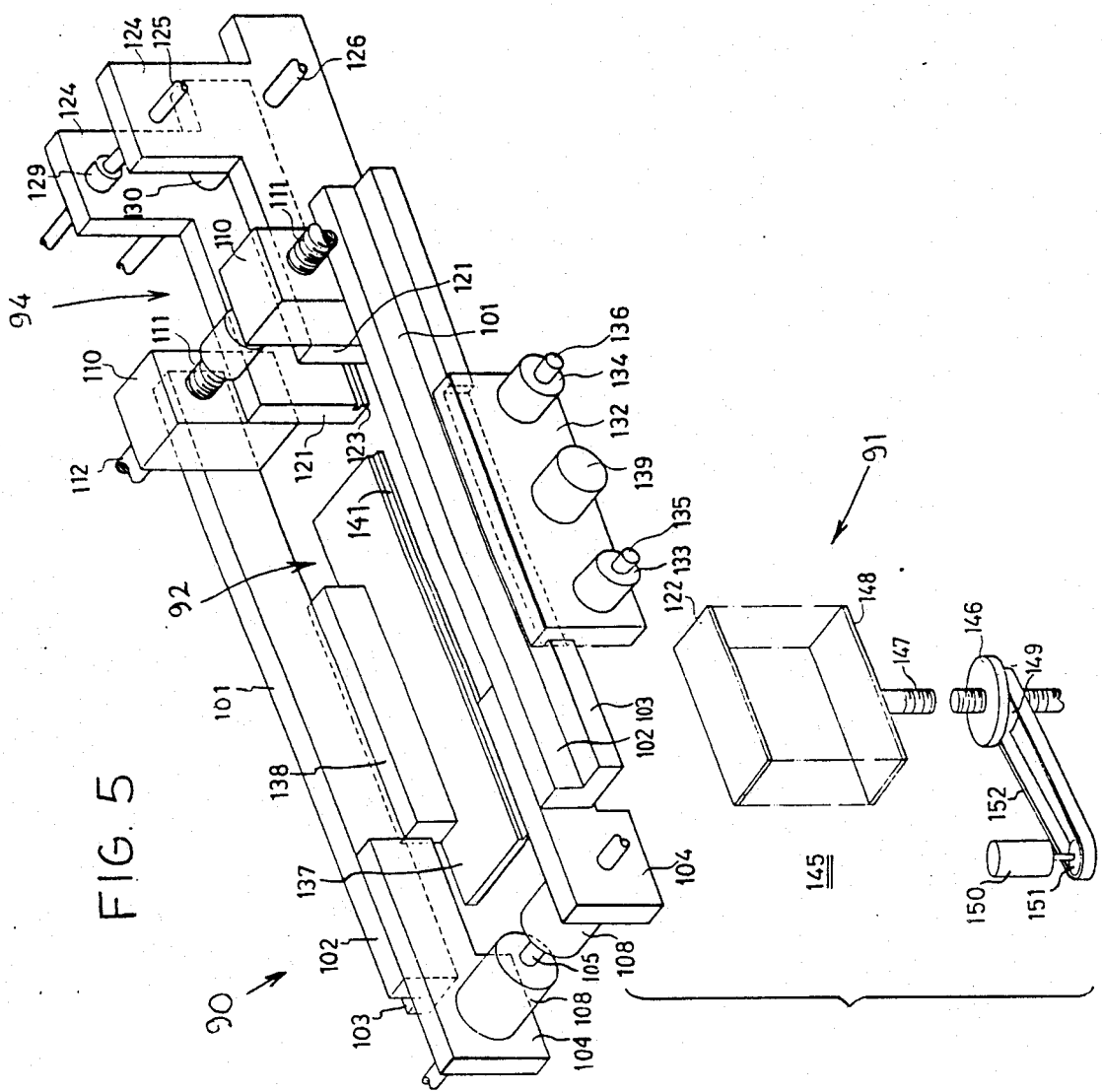
Figure 6:
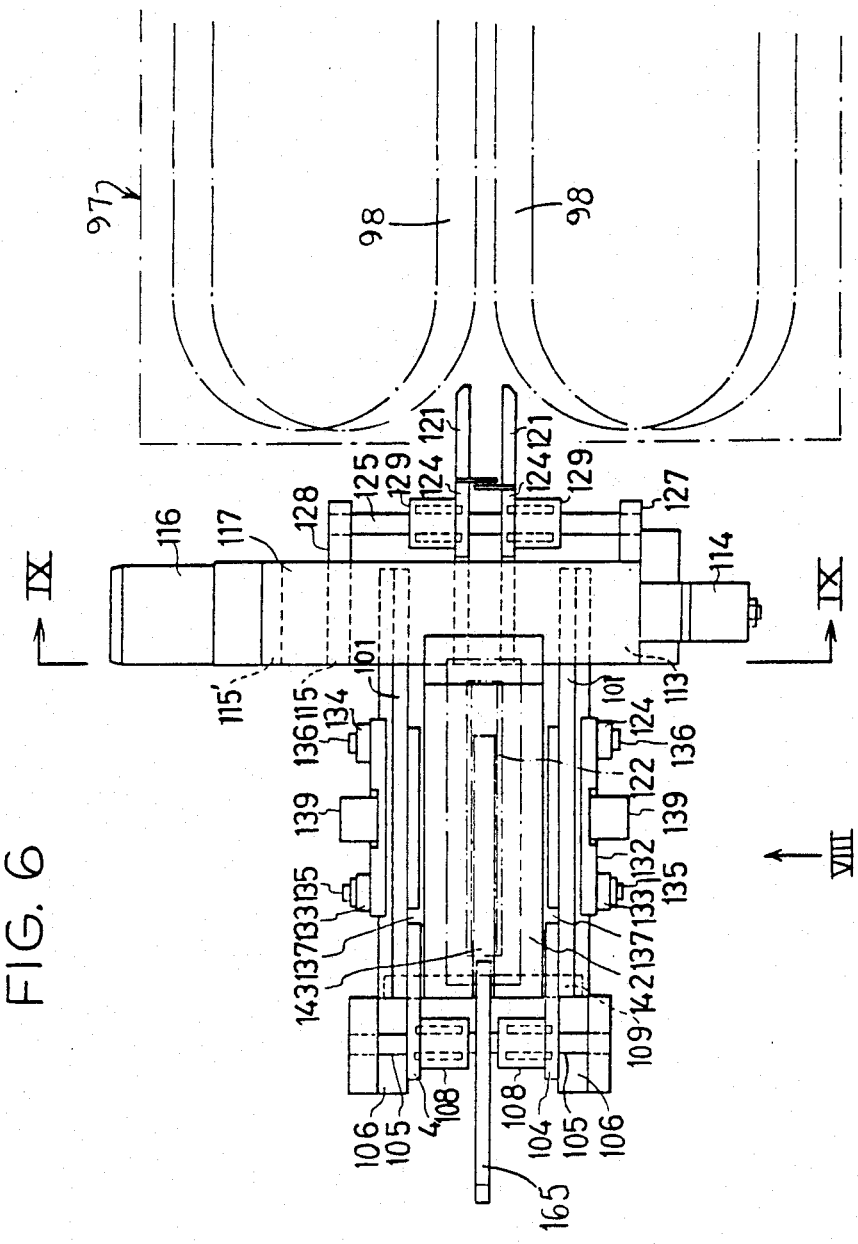
Figure 7:
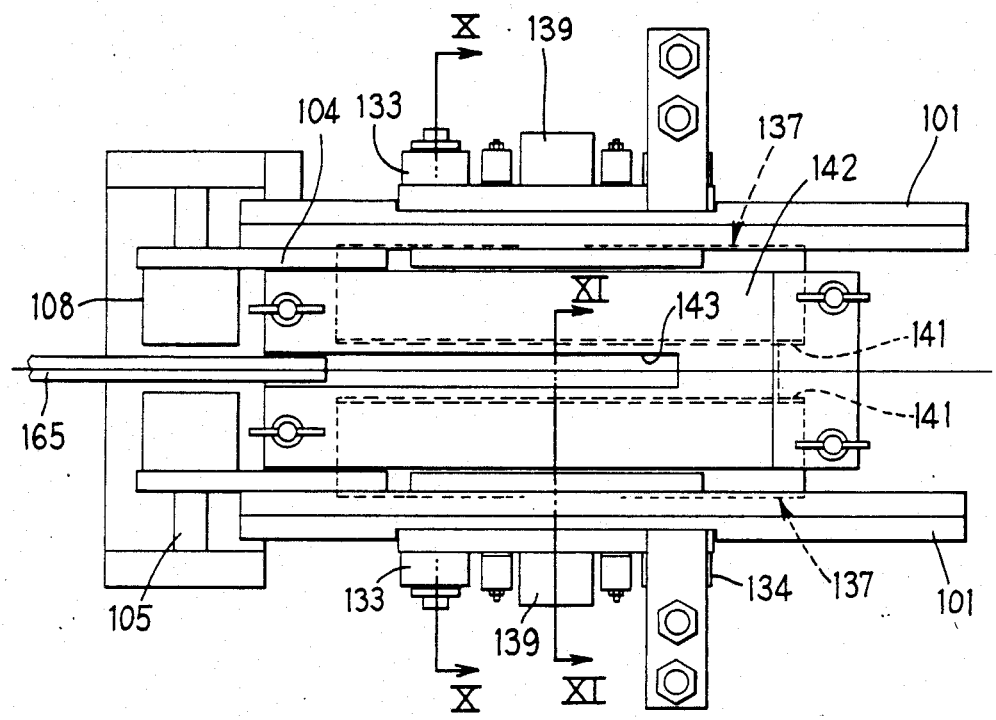
Figure 13:
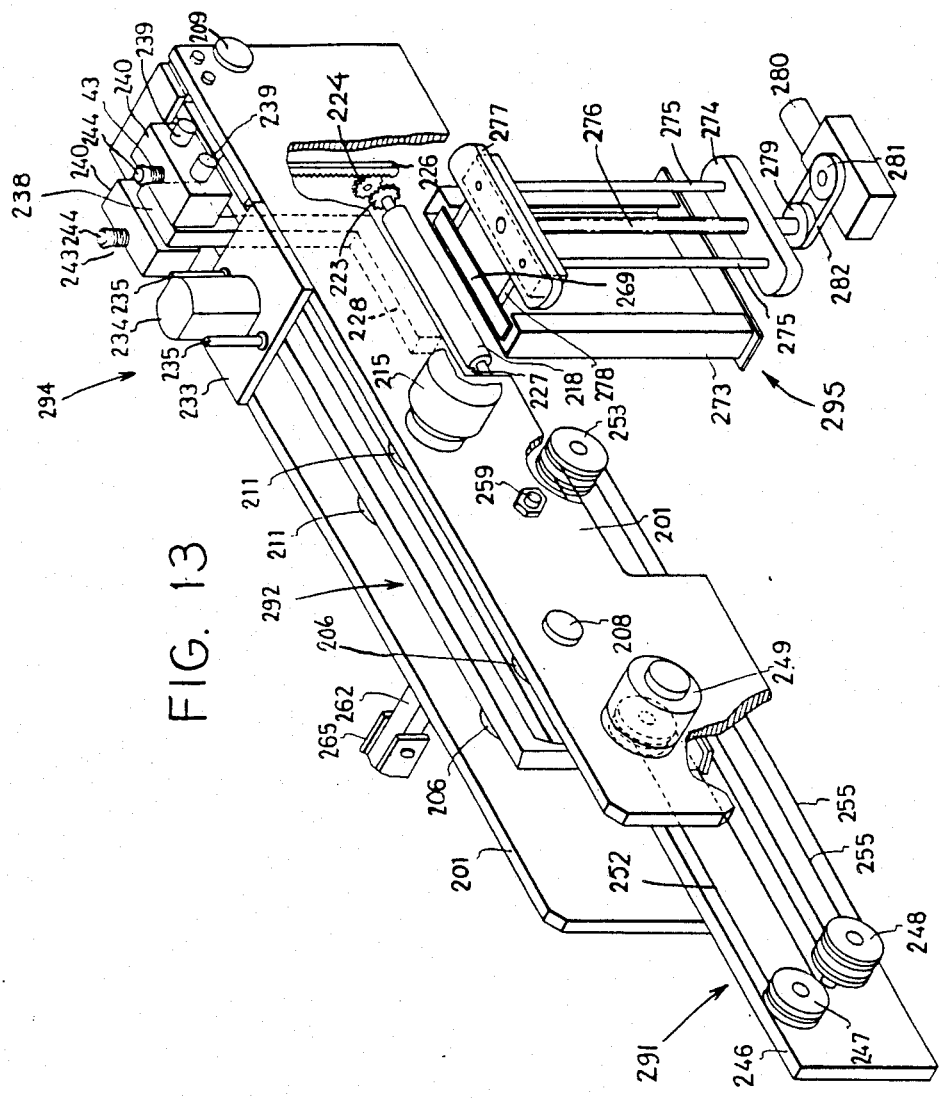
Figure 14:
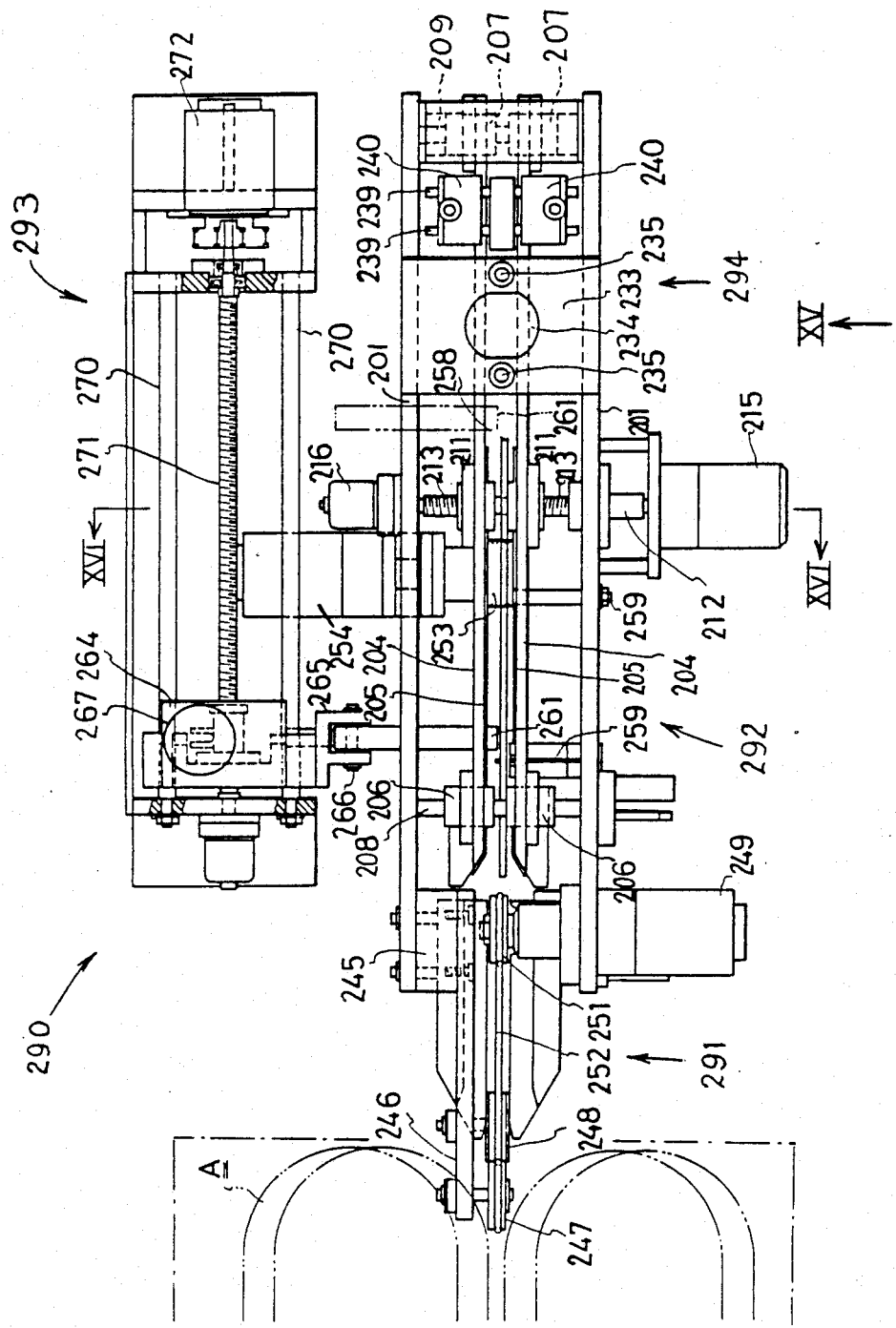
Figure 15:
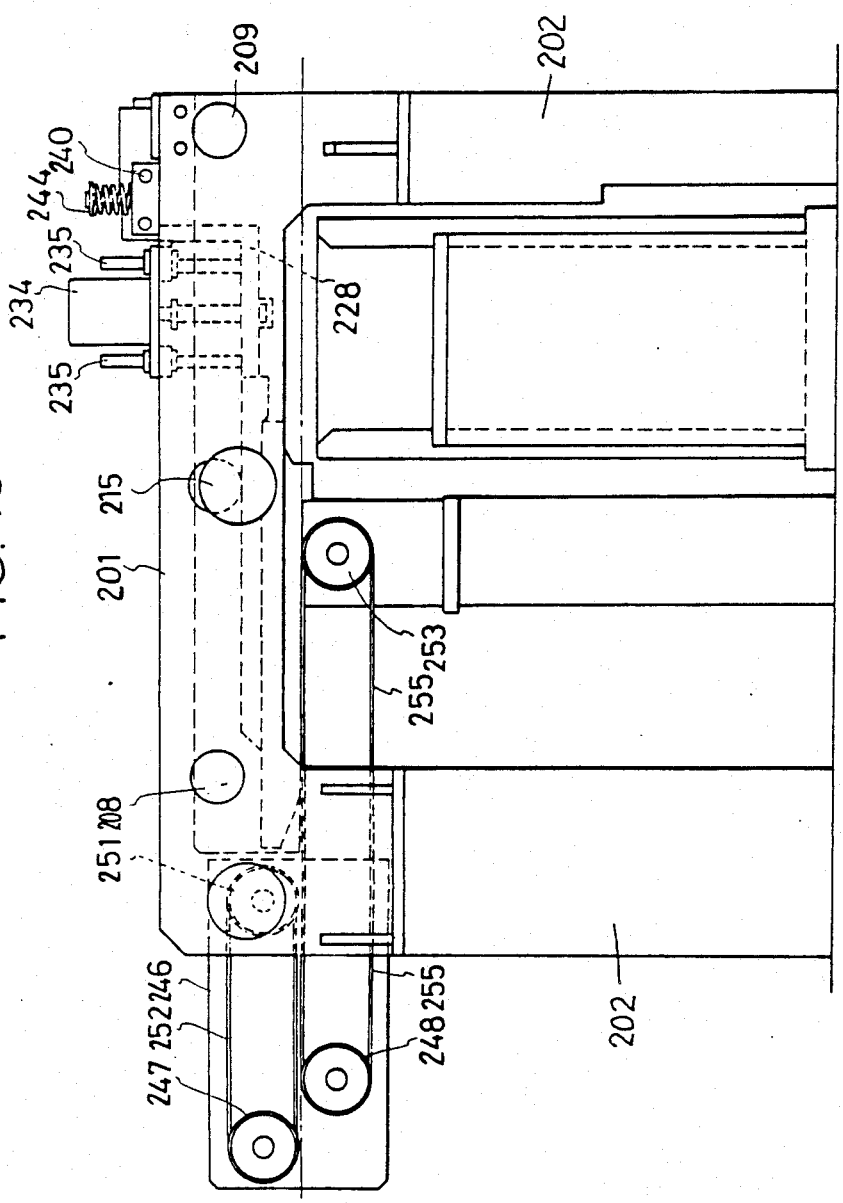
Figure 16:
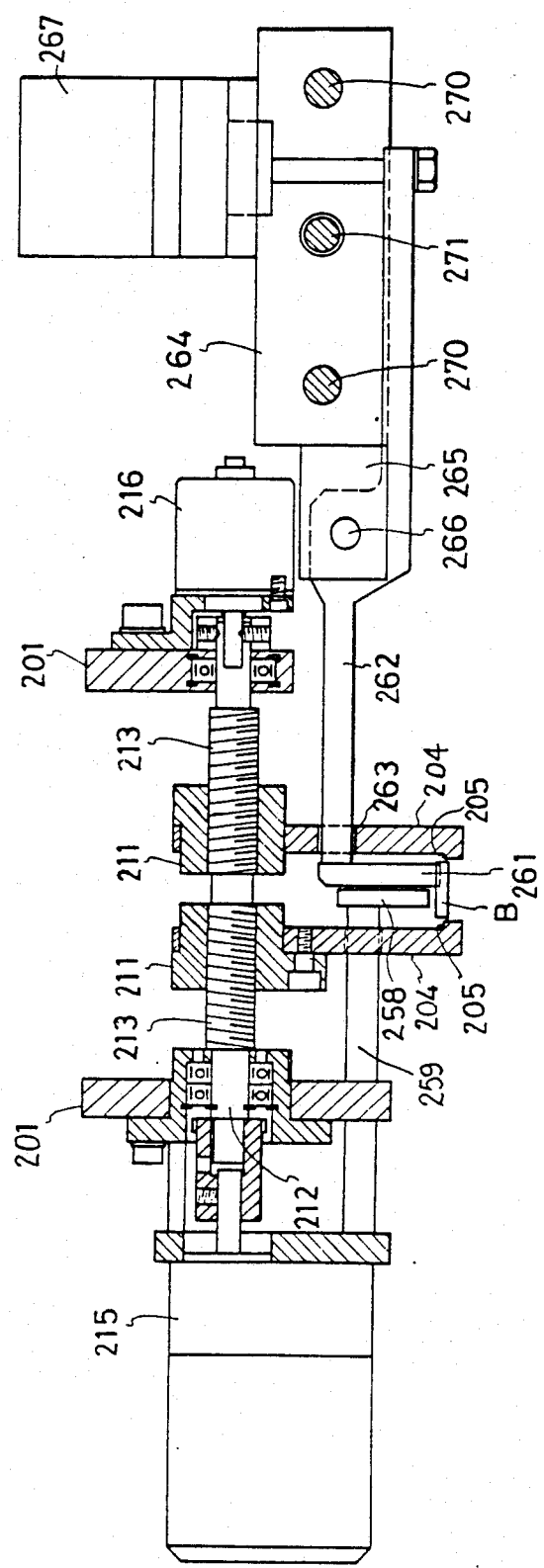

Certain terminology will be used in the following description for convenience in reference only, and will not be limiting. For example, the words "upwardly", "downwardly", "rightwardly" and "leftwardly" will refer to directions in the drawings to which reference is made. The word "forwardly" will refer to the normal direction of movement of the lead frame through the apparatus, which movement in FIGS. 5 and 13 is from left to right. The words "inwardly" and "outwardly" will refer to directions toward and away from, respectively, the geometric center of the apparatus and designated parts thereof. Said terminology will include the words specifically mentioned, derivatives thereof, and words of similar import.

DETAILED DESCRIPTION

Referring initially to FIGS. 1-4, there is illustrated the adjustable guideway arrangement 10 according to the present invention. This arrangement 10 includes a pair of opposed and substantially parallel stationary support plates 11 which are elongated horizontally. These support plates 11 movably and adjustably support therebetween a pair of opposed and substantially parallel guide plates 14. These guide plates 14 have the spacing "n" therebetween selectively varied by means of an adjusting device which includes an electric motor 12 which is mounted on one of the support plates 11 and is drivingly coupled to a spindle or shaft 13 which is rotatably supported on and extends perpendicularly between the support plates 11. This rotary shaft 13 has spaced threaded portions which are threaded in opposite directions and disposed in threaded engagement with portions of the guide plates 14 so that rotation of the shaft 13 causes the guide plates 14 to be synchronously moved either toward or away from one another depending upon the direction of rotation.

The end of the shaft 13 remote from the motor 12 projects outwardly beyond the other support plate 11 and is coupled to an encoder 15 which is capable of measuring the rotation of the shaft, and hence determining the adjusted position of the guide plates 14.

To provide smooth linear support for the guide plates 14, particularly during their adjustment, the guide plates 14 are supported on the support plates 11 through a plurality of linear ball-slide arrangements each of which includes a guide bar or rod 16 which is fixed to and extends perpendicularly between the supporting walls 11, and a linear ball-slide device 17 which is linearly slidably supported on and in surrounding relationship to the shaft 16 and has its housing secured to one of the guide plates 14. Each of the guide plates 14 is slidably supported by a pair of these linear ball-slide devices which are disposed in longitudinally spaced relationship on opposite sides of the adjusting shaft 13.

Figure 1:
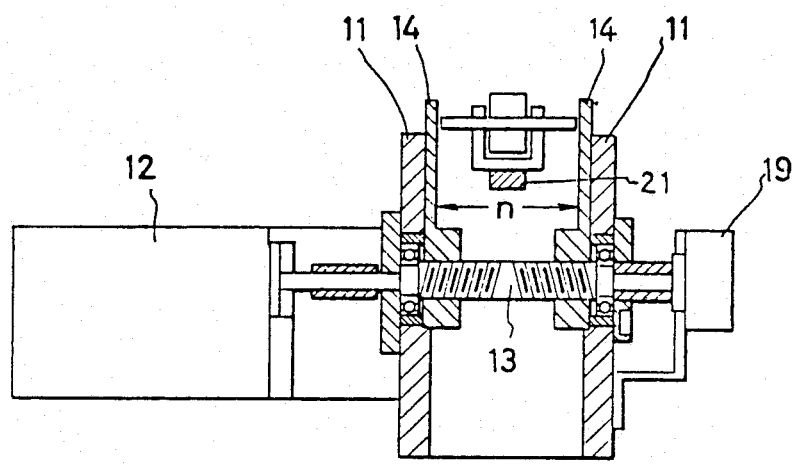
Figure 2:
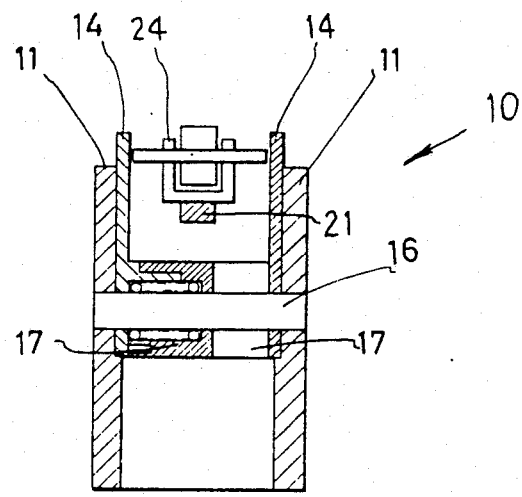

The guideway arrangement illustrated by FIGS. 1 and 2 is preferably disposed for cooperation with a conveyor mechanism, and FIG. 3 diagrammatically illustrates the support plates 11 and the respective guide plates 14 disposed closely adjacent the opposite sides of the upper reach 21 of an endless conveyor belt. The conveyor belt 21, in the illustrated embodiment, runs from a location disposed tangential to a rotatable turntable 22 which supports thereon cassettes 23 filled with lead frame units, similar to that illustrated by aforementioned U.S. Pat. No. 4,555,876. The lead frame units are individually discharged from the cassette 23 onto the conveyor belt 21, with the lead frame units then being slidably guided by the width of the gap between the guide plates 14 and fed into a blasting chamber. The belt 21 preferably has some type of upwardly projecting drive lug 24 associated therewith so as to engage and hence positively forwardly drive the lead frame units.

Figure 8:
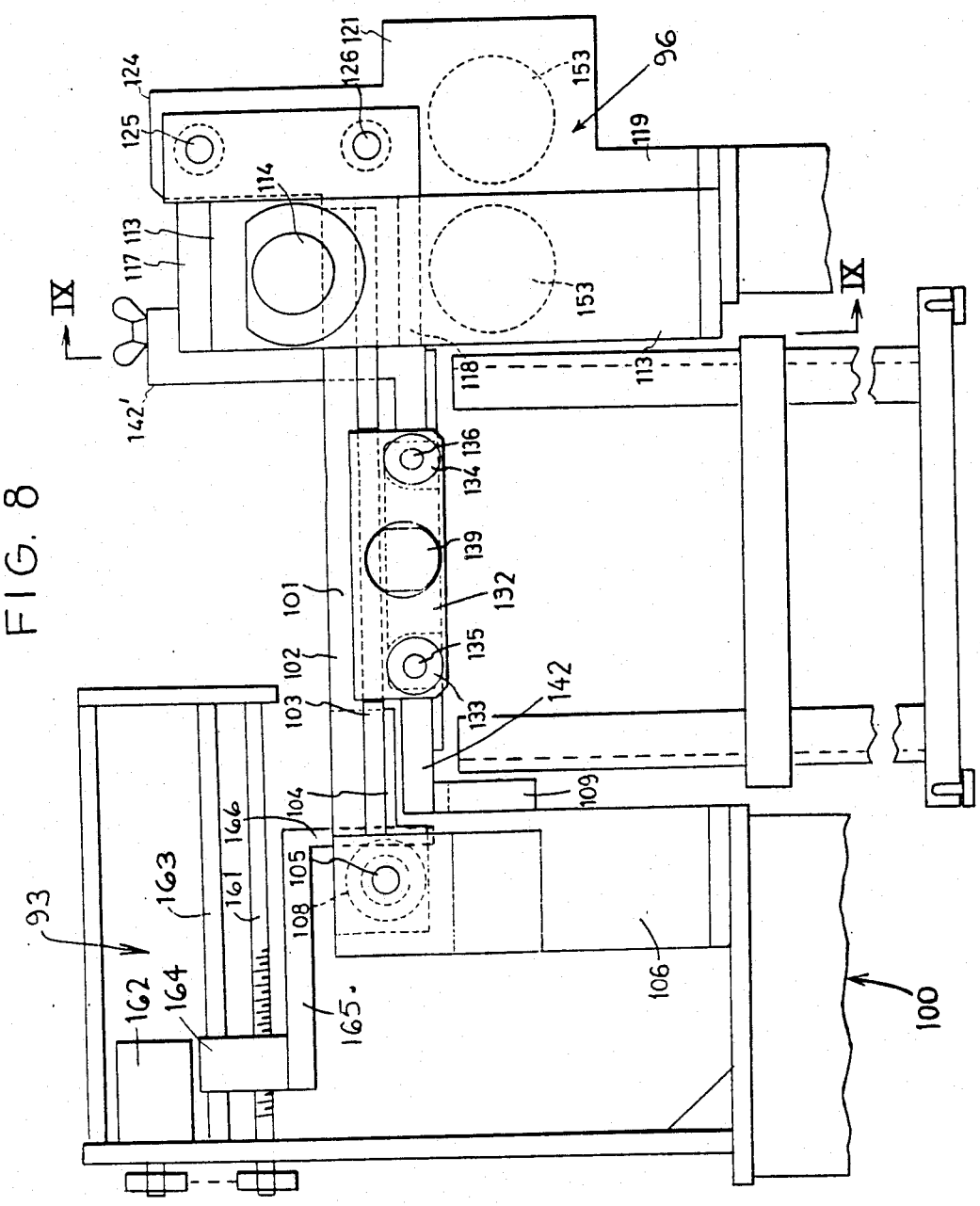
Figure 9:
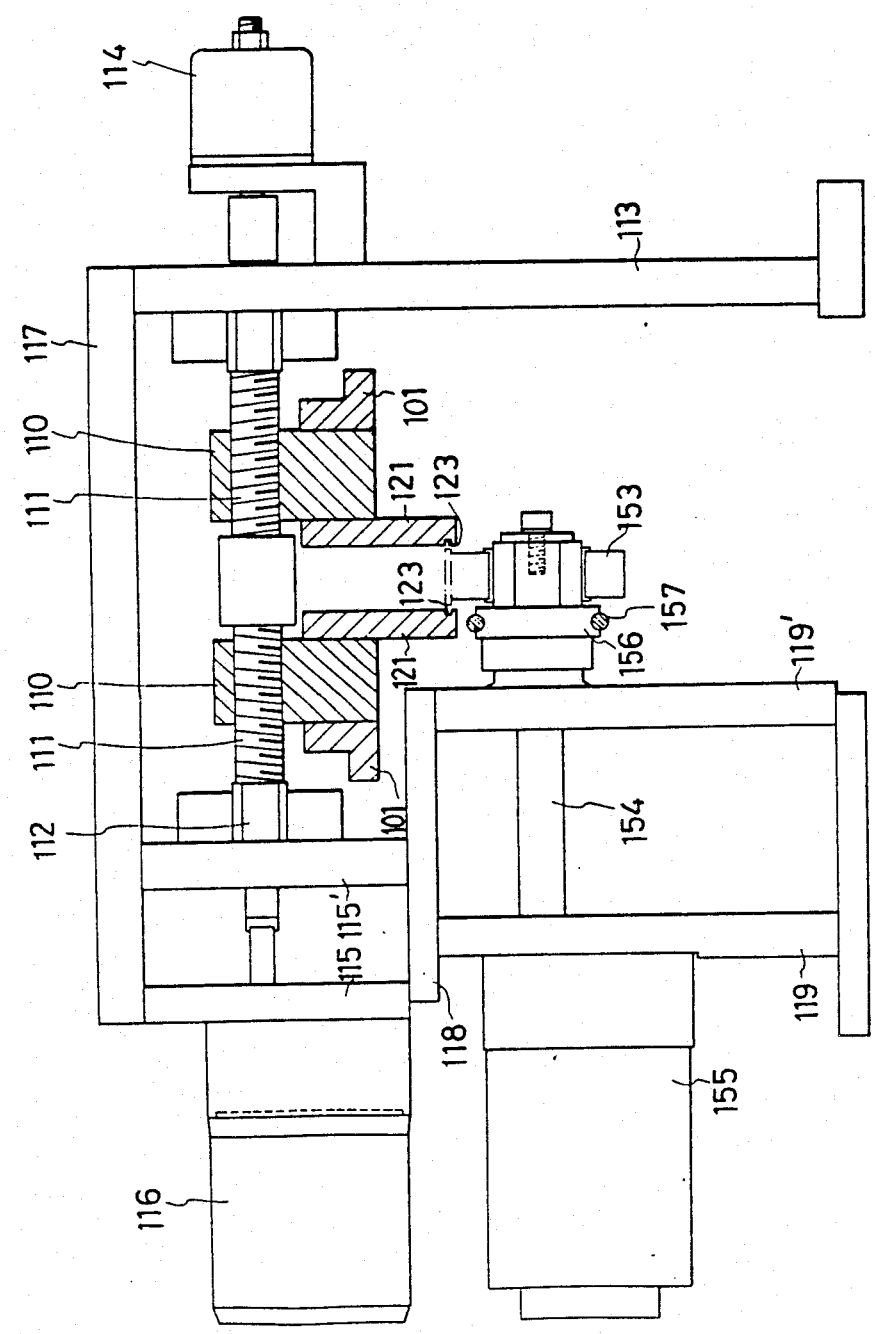

Referring now to FIGS. 5-12, there is illustrated a feeding device 90 according to the present invention, which device is particularly suitable for feeding lead frame units individually and sequentially into a blasting chamber. This feeding device 90 includes a supply structure 91 containing a stack of lead frame units which are individually separated by means of a chuck structure 92, the latter being disposed adjacent the upstream end of the adjustable guideway arrangement 94. A suitable drive 93 (FIG. 8) cooperates with the lead frame unit held by the chuck structure 92 for individually and horizontally moving it into and through the guideway arrangement 94. The individual lead frame unit, when leaving the guideway arrangement 94, is engaged by a driving or conveying arrangement 96 (FIG. 8) which forwardly advances the lead frame unit into the input end of a conventional blasting chamber 97 (FIG. 8). The individual lead frame units are horizontally moved through the blasting chamber and subjected to an appropriate blasting media, such as a media impelled by a stream of water, to effect removal of undesired resin such as burr and flash. To support the lead frame unit while it is being transported through the blasting chamber 97, the latter is provided with a pair of endless drive belts 98 having opposed sidewardly spaced reaches and mounting suitable lugs or cleats which permit the lead frame unit to be horizontally supported therebetween and hence exposed to the streams of blasting media.

The structure of the blasting chamber is conventional, and reference is made to aforementioned U.S. Pat. No. 4,555,876 which discloses this structure in greater detail.

The feeding device 90 includes a stationary frame or housing 100 which movably mounts thereon a pair of spaced, parallel and horizontally elongated support plates or beams 101 which are each substantially of L-shaped cross section having a vertical leg 102 and an outwardly projecting horizontal leg 103. The support plates 101 fixedly mount thereon, adjacent the upstream or inlet end of the device, a pair of outwardly projecting plates 104, the latter having a spindle or rod 105 extending therebetween for slidably supporting the plates on the spindle through linear ball bearing units 108. The spindle 105 is stationarily mounted on and extends between upright columns 106 which are fixedly associated with the frame, whereby the plates 104 are slidably supported by the spindle 105 for slidable movement toward and away from one another.

The support plates 101, adjacent their downstream ends, have blocks 110 secured thereto and provided with threaded openings extending transversely thereof, which threaded openings are engaged with threaded portions 111 of a transversely extending rotatable shaft 112. The threaded shaft portions 111 which are engaged with the pair of spaced blocks 110 are reversely threaded (that is, threads of opposite hand) so that rotation of the shaft 112 causes the blocks 110 to be simultaneously moved inwardly toward one another or outwardly away from one another, depending on the direction of rotation. The shaft 112, at one end thereof, is coupled to a driving motor 116, and at the other end thereof is coupled to a conventional encoder 114 for measuring shaft rotation and hence displacement or position of the blocks 110.

The shaft 112 is rotatably supported on a plurality of vertical frame plates 113, 115 and 115', which plates adjacent their upper ends are rigidly joined together by a cover plate 117. The frame plates 115 and 115' are rigidly secured to a horizontal frame plate 118, and the latter in turn is secured to additional vertical frame plates 119 and 119'.

The guideway arrangement 94 is fixedly associated with, and in fact includes, the support plates 101. This guideway arrangement 94 includes a pair of parallel and sidewardly spaced guide plates 121 which have their rearward ends fixed to the respective blocks 110, with the plates 121 projecting horizontally forwardly therefrom toward the inlet end of the blasting chamber. Each of these guide plates 121 has a guideway 123 formed on the inner face thereof, which guideway 123 in effect defines a shallow inwardly opening slot which is horizontally elongated throughout the inner face of the guide plate, whereby the slots 123 of the two guide plates are disposed in opposed and facing relationship with one another.

The guide plates have upwardly protruding portions 124, and a pair of vertically spaced spindles 125 and 126 extend between and through the protruding portions 124, the spindles having their outer ends stationarily secured to stationary frame plates 127 and 128 which are fixedly disposed on opposite sides of the device. The spindles 125 and 126 slidably and guidably support thereon the guide plates 121 through intermediate linear ball bearings 129 and 130.

With the above arrangement, rotation of the shaft 112, acting through the adjustment blocks 110, permits the opposed guide plates 121 and the rigidly interconnected support plates 101 to be simultaneously and synchronously moved either toward or away from one another so as to adjust the width of the spacing between the opposed guide grooves 123. This width is hence selected in accordance with the width of the lead frame unit being handled.

Considering now the chuck structure 92, it is carried by and movably disposed substantially between the opposed support plates 101. For this purpose, each support plate 101 has a mounting plate 132 fixed to the outer side and intermediate the length thereof. A pair of parallel and spaced-apart guide rods 135 and 136 are slidably supported on the mounting plate 132 through conventional linear ball bearings 133 and 134, respectively. These guide rods 135 and 136, at their inner ends, are secured to the vertically projecting leg 138 of a holding or chuck plate 137. A pair of these chuck plates 137 are disposed between the supporting plates 101 in opposed relationship, with the individual chuck plates being slidably supported for movement toward and away from one another on the respective supporting plate 101. For this purpose, each mounting plate 132 has a drive unit in the form of an air cylinder 139 mounted thereon, the piston rod 140 of which projects through the mounting plate and is also secured to the chuck plate 137 for controlling reciprocal movement thereof.

The chuck plates 137 are of substantially L-shaped configuration in that each includes a horizontal plate or leg which projects inwardly in opposed relationship to the opposite chuck plate. These legs, at their inner free edges, are provided with a steplike groove running therealong, which groove opens upwardly and defines an upwardly facing shoulder 141. These grooves, as defined above the shoulders 141, extend horizontally in the longitudinal direction of the chuck plates 137 so as to be aligned with and at substantially the same elevation as the guide grooves 123 formed in the guide plates 121.

Figure 10:
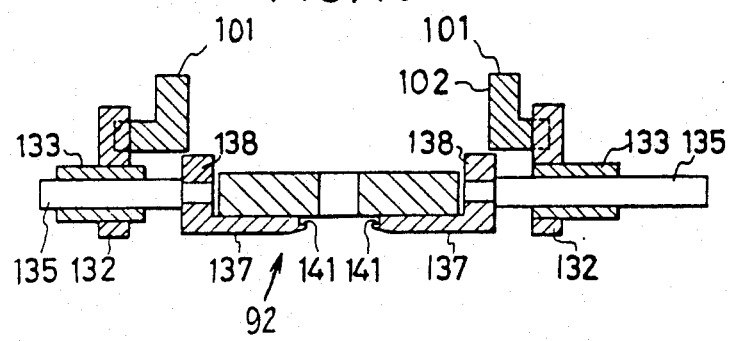
Figure 11:
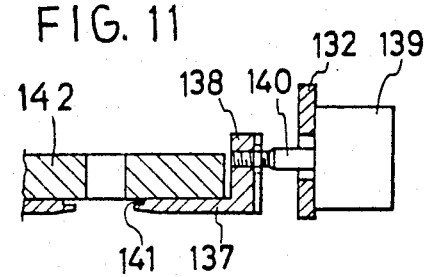

To provide control over the lead frame unit when the latter is held between the chuck plates 137, or is being slidably moved along the shoulders 141 or guide grooves 123, the feeding device also includes a top hold-down plate 142 which extends along and is spaced upwardly from the longitudinal pathway defined by the shoulders 141. This top plate 142 is disposed between the vertical legs of the chuck members 137 and is disposed substantially over the horizontal legs thereof. This top plate 142 extends longitudinally throughout substantially the complete length of the chuck members. Top plate 142, as illustrated by FIGS. 10 and 11, is disposed so as to substantially directly contact, or at least is positioned very closely adjacent, the upper surfaces of the horizontal legs of the chuck members 137. The top plate 142 has one end thereof fixedly secured to the frame, such as to the crossbar 109 which is secured to the columns 106. The other or downstream end of the cover 142 has an upwardly projecting L-shaped leg 142' which projects upwardly and is fixedly secured to the frame cover 117. This hence provides the overall top plate with a substantially Z-shaped configuration in the longitudinal direction.

The cooperation of the top plate 142 with the horizontal chuck legs 137, and more specifically its cooperation with the shoulders 141, results in the cover plate 142 effectively closing off the upper boundary of the region above the shoulders 141 so as to effectively define inwardly opening grooves similar to and aligned with the guide grooves 123, whereby the lead frame unit can be slidably confined within the grooves defined above the shoulders 141, but below the top cover 142.

The top cover 142 has an elongated slot 143 extending longitudinally thereof, which slot projects downwardly for communication with the region between the shoulders 141 so as to permit a pusher-type drive element to be inserted therethrough.

This latter-mentioned pusher-type drive element is associated with the drive 93 which, as illustrated in FIG. 8, employs a motor 162 which is supported on the frame and, through a drive train such as a belt-and-pulley arrangement, drives a rotatable threaded shaft 161, the latter being rotatably supported on the frame. A further guide rod 163 is supported on the frame and extends generally parallel to the shaft 161. A slide 164 is slidably supported on rod 163 and threadably engaged with shaft 161 so that driving of motor 162 causes the slide to linearly advance either forwardly or rearwardly in a direction generally parallel with the longitudinal direction of the feed device. This slide 164 has a pusher-type drive bar 165 thereon, the latter having a downwardly projecting nose portion 166 which projects downwardly through the slot 143 into the region between the shoulders 141 so as to hence engage the rearward edge of the lead frame unit which is supported on the chuck plates, so that the lead frame unit can be slidably advanced forwardly (rightwardly in FIG. 8) into the guideways 123.

When the lead unit frame is advanced into the guideways 123 associated with the guide plates or rails 121, the lead frame unit is now positively held vertically within the slots 123 since they have upper and lower opposed walls or shoulders. The lead frame unit is now engaged by and driven forwardly by means of the transporting drive or conveyor 96. This latter conveyor or transporting drive is formed by a plurality of rotatable drive wheels 153 which are rotatably supported on the frame for rotation about horizontal axes which extend substantially perpendicular to the longitudinal advancing direction, with several such driving wheels being horizontally spaced in the longitudinal direction. One of the drive wheels 153 is mounted on a spindle or shaft 154 which is drivingly interconnected to a driving motor 155. The other of the drive wheels 153 are synchronously driven through an endless drive belt 157 which is in driving engagement with pulleys 156 which are fixedly associated with the respective drive wheels 153. The drive wheels 153, which preferably comprise a brush wheel, contact the underside of the lead frame unit which is supported in the guideways 123, whereby the lead frame unit is hence driven longitudinally forwardly along the guideways 123 until the leading end of the lead frame unit enters into the blasting chamber and is supported by the opposed conveying belts 98. These latter belts then drivingly engage and supportingly move the lead frame unit into and through the blasting chamber.

To feed the lead frame units up to the chuck structure 92, there is provided the supply device 91 which is only diagrammatically illustrated in FIG. 5. This device includes an upright holder or cassette 145 in which are vertically stacked a plurality of lead frame units. One such lead frame unit is diagrammatically illustrated and designated at 122, this being representative of the uppermost unit of the stack. The cassette 145 is removably supported directly beneath the chuck plates 137, and the cassette has a lifting or elevator plate 148 which is insertable into the bottom of the cassette for engagement with the lowermost lead frame unit of the stack. This plate 148 is secured to the upper end of a rotatable lifting column, such as a threaded shaft 147. The latter is engaged with a rotatable pulley 146 which, through a further pulley 149, a drive belt 152 and a drive pulley 151, is driven from a motor 150. Rotation of the motor hence effects lifting of the plate 148 so as to upward lift the stack of lead frame units. When the reversible motor 150 is energized to cause the lift plate 148 to move upwardly, the uppermost lead frame unit 122 is moved upwardly between the open and spaced chuck plates 137, with the lead frame unit being pressed upwardly against the underside of the top plate 142. This upward pressing of the lead frame against the top plate 142 tends to straighten the lead frame unit and remove or minimize the distortion thereof. The cylinders 139 are then energized so that the chuck plates 137 move inwardly toward one another through a selected extent so that the opposite longitudinal edges of the lead frame unit are disposed closely adjacent and directly above the shoulders 141. The motor 150 is then reversely rotated a small extent so that the remaining stack of lead frame units is slightly lowered, thereby leaving the uppermost lead frame unit supported on the shoulders 141.

After the uppermost lead frame unit has been engaged and supported by the chuck plates as explained above, then the lead frame unit is linearly movably advanced into and through the guideways 123 and thence into the shot-blasting chamber as explained above.

Figure 12:
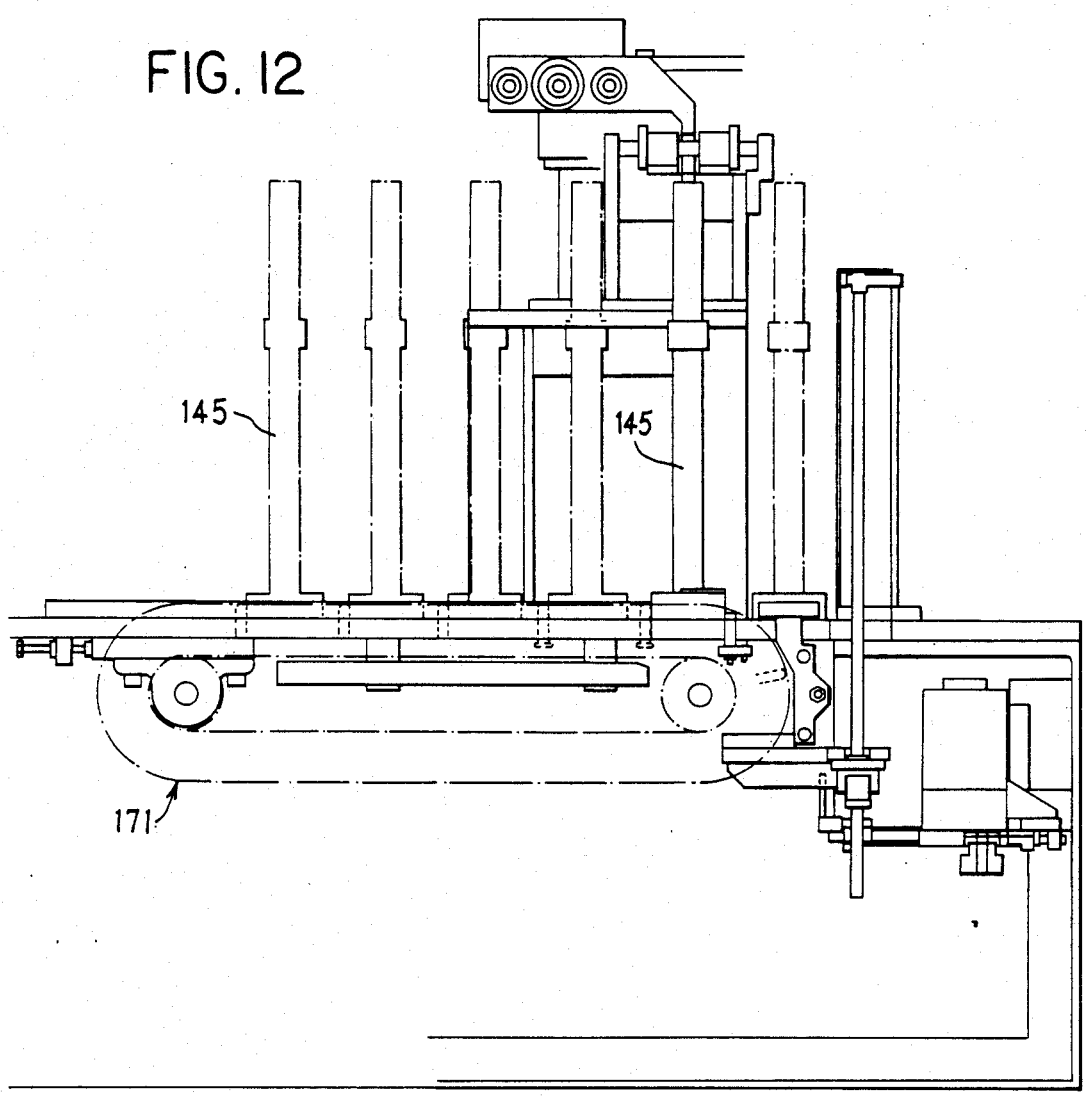

While FIG. 5 illustrates only diagrammatically the supply device 91 for the lead frames, this device is illustrated in greater detail in FIG. 12. As this latter figure indicates, the overall feeding device preferably involves an endless supply conveyor 171 which moves toward but under the chuck structure 92 in a transverse direction relative to the longitudinal feeding direction of the device. This conveyor 171, on the upper reach thereof, preferably supports a plurality of cassettes 145 each containing a stack of lead frame units. These are then sequentially moved into position below the chuck structure 92. When the cassette being unloaded is disposed directly below the chuck plates, then the lifting device, which is sidewardly spaced but has the lifting plate 148 projecting sidewardly so as to engage the stack of lead frame units, can then be lifted upwardly so as to sequentially feed the lead frame units into engagement with the chuck plates.

The lifting device for the lead frame units is illustrated and explained in greater detail with respect to FIG. 13 as described hereinafter.

Reference will now be made to FIGS. 13–19 which illustrate the delivery device for transporting the lead frame units away from the blasting chamber. This delivery device incorporates therein many of the same adjustments and movements associated with the feeding device described above.

More specifically, the delivery device 290, directly adjacent the discharge end of the blasting chamber, has a conveying section 291 for transporting the individual lead frame units into the longitudinally elongated guideway arrangement 292, which guideway arrangement has a drive 293 associated therewith for forwardly advancing the individual lead frame units. From the guideway the lead frame units are moved onto a transfer unit 294 which deposits the lead frame units into a vertical stack within a removable cassette associated with a structure 295 for collecting and removing the lead frame units.

Considering first the guideway arrangement 292, it is formed by parallel and horizontally elongated support plates 201 which are fixed to the frame in sidewardly spaced relationship so as to be substantially aligned with the discharge end of the blasting chamber. These support plates have a pair of guide plates 204 positioned therebetween in parallel and opposed relationship, which plates 204 extend between and are slidably supported on spindles or bars 208 and 209 which are fixed to the support plates 201, with appropriate linear ball bearings 206 and 207 being provided for freely slidably supporting the guide plates 204 on the spindles 208 and 209.

The plates 204 have adjusting blocks 211 fixed thereto substantially at the midpoint thereof, which blocks are threadably engaged with oppositely threaded portions 213 of a rotatable shaft 212 which extends transversely between the support plates 201. The shaft 212 is being connected to a motor 215 at one end and to a distance or motion encoder 216 at the other end. This hence permits the spacing between the guide plates 204 to be accurately adjusted in the same manner as described relative to the other embodiments.

Each of the guide plates 204 has, adjacent the lower longitudinally and horizontally extending lower edge thereof, an inwardly projecting step which defines thereon an upwardly facing shoulder 205. These steps are disposed directly opposite one another so as to hence define a support for a lead frame unit, such unit being designated B in FIG. 16.

To hold the lead frame unit B on the shoulders 205, there is provided a horizontally elongated top plate 258 which extends generally parallel with and between the guide bars 204. This top plate 258 has the lower edge thereof extending generally parallel with the shoulders 205 but spaced upwardly a slight distance therefrom so as to be disposed closely adjacent the upper surface of the lead frame B as it is moved along the guideways. This top plate 258 extends substantially the full length of the guideway and is fixedly secured adjacent opposite ends thereof by fixing bars 259 and 259' which are secured thereto and project transversely therefrom for connection to the side support plate 201.

To move the lead frame units individually from the blasting chamber into the inlet or upstream end of the guideway arrangement 292, the conveying section 291 is provided in alignment with the guideway arrangement 292. This conveying section 291 includes a horizontally elongated fixing bar 246 which is fixed to and projects horizontally upstream from the support plate 201, with an appropriate fixing block 245 being provided therebetween. This horizontally elongated fixing plate 246 mounts a first pulley 247 thereon for rotation about a substantially horizontal axis, which pulley is in engagement with one end of a top endless round belt 252, the other end of this belt 252 being engaged with a drive pulley 251 which is parallel with but positioned horizontally downstream from the pulley 247. Pulley 251 is driven by the motor 249. Positioned below but closely adjacent the upper belt 252 is a further pair of substantially parallel and sidewardly spaced lower belts 255. These latter belts are also endless and have the upstream ends thereof engaged with a further pulley 248 which is rotatably mounted on the fixing plate 246. The downstream ends of the belts 255 extend around another rotatable pulley 253 which is disposed in the vicinity of the threaded adjusting shaft 212 and is driven by the motor 254.

The reaches of these latter belts, as they extend between the respective pulleys, all extend generally horizontally, and the lower reach of the upper belt 252 extends generally parallel with and is spaced upwardly a small distance from the upper reaches of the lower belts 255. Further, these reaches define therebetween a region which is generally aligned with the guide shoulders 205 associated with the guide plates 204.

When the lead frame unit is discharged from the blasting machine, it is moved into engagement with and held between the lower reach of the top belt 252, and the upper reaches of the lower belts 255. These belts move the lead frame unit horizontally in a rightward direction in FIG. 15, although the upper belt 252 terminates adjacent the upstream end of the guide plates 204. These belts drive the lead frame unit onto the shoulders 205, and since the lower belts 255 extend further downstream than the upper belt, the lower belts continue to slidably drive the lead frame unit until it is totally supported on the guide plates 204.

After the lead frame unit has been transferred onto the shoulders 205 of the guide plates 204, the rearward or upstream end of the lead frame unit is engaged by the pusher rod 261 of the driving mechanism 293 so as to further advance the lead frame unit.

This mechanism 293 includes a pusher bar 261 positioned between the guide plates 204, which bar 261 has an arm 262 projecting sidewardly through a horizontally elongated slit 263 as formed in one of the guide plates. The sidewardly projecting arm 262 is hingedly supported intermediate its length by a pivot 266, the latter being provided on a bracket 265 which is secured to a horizontal slide or transfer member 264. This latter slide 264 is slidably supported on a pair of horizontally elongated but stationary guide rods 270 which extend generally parallel with the longitudinal direction of the delivery device. Slide 264 is also engaged with an elongated rotatable threaded rod 271 which is rotatably driven by a motor 272. Rotation of motor 272 and shaft 271 causes the slide 264 to be horizontally displaced, causing a forward advancing of the pusher 261 so as to engage and forwardly advance the lead frame unit. During this advancing movement, the pusher 261 is maintained in a lowermost position by swinging the outer end of the transverse arm 262 upwardly about the pivot 66. For this purpose, the outer end of arm 262 is connected to the piston rod of a fluid pressure cylinder 267, the latter being mounted on the slide 264 for movement therewith.

Figure 17:
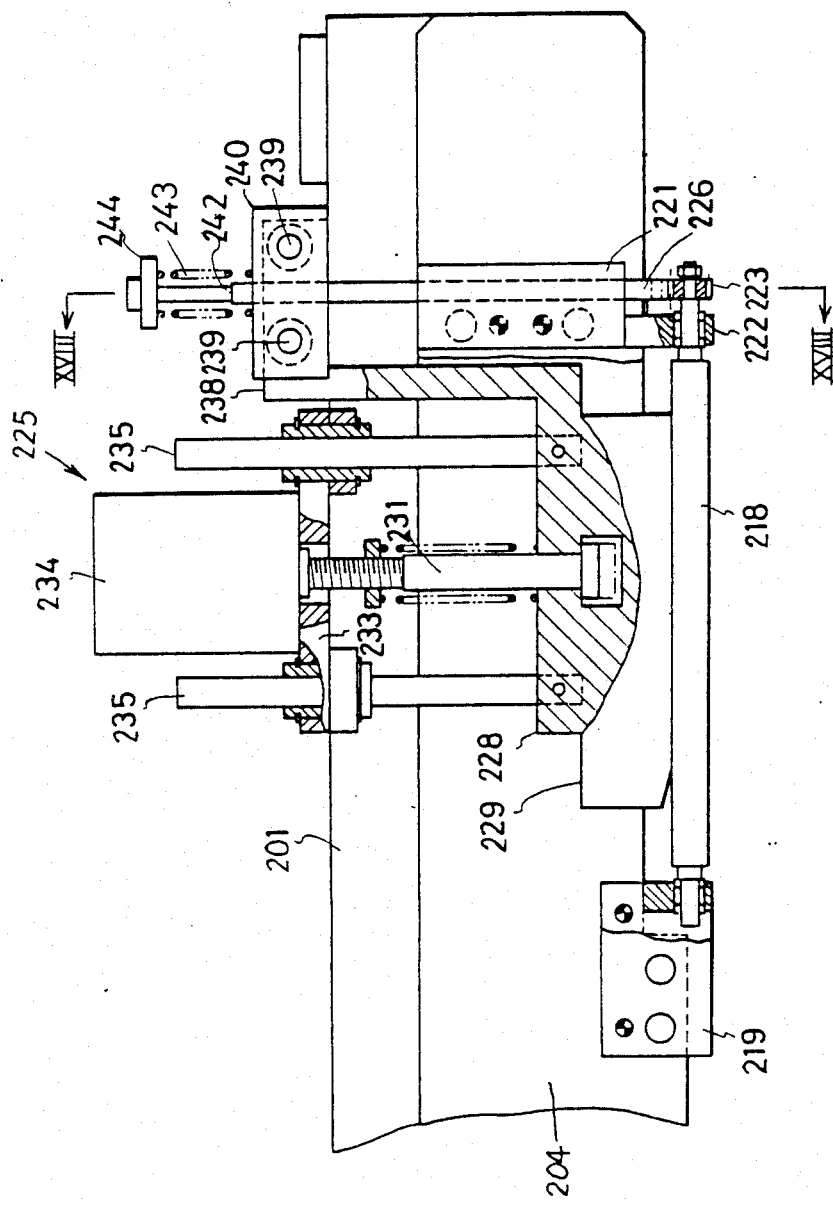

Considering now the transfer apparatus 294, same is positioned adjacent the downstream end of the feeding device, specifically adjacent the downstream end of the guide bars 204. This transferring device 294 includes a pair of elongated holding bars 218 which are sidewardly spaced apart so as to be individually disposed substantially directly adjacent the lower edge of the guide plates 204. Each holding bar 218 is elongated generally parallel with the longitudinal direction of the device and, as illustrated in FIG. 17, has outwardly projecting hub portions at opposite ends, one of which is rotatably supported in an L-shaped bracket 219 which is secured to the outside of the respective supporting plate 204. The one end of the holding bar is similarly rotatably supported in a further bracket 222 which is also fixed to the respective support plate 204. The one end of this holding bar 218 has a pinion 223 thereon which meshes with an intermediate pinion 224, the latter being driven by a vertically elongated gear rack 226 which is movably supported as explained below.

As illustrated by FIG. 19, the holding bar 218 has a steplike groove formed on the inner side thereof and projecting longitudinally thereof, which groove defines an upwardly facing shoulder 227. This shoulder 227, when the holding bar 218 is in the receiving position illustrated by solid lines in FIG. 19, is aligned with the guideway shoulders 205 so as to support thereon an edge of the lead frame unit. When supporting a lead frame unit B thereon as illustrated by FIG. 19, the pair of sidewardly spaced holding bars 218 are rotatable in opposite directions into a discharge position substantially as illustrated by dotted in lines in FIG. 19, in which position the lead frame unit is dropped or discharged into the upper end of a cassette 273.

To control the discharge of the lead frame unit B from the holding bars 218, the transferring mechanism 294 includes a reciprocal drive device 225 which ensures both the downward discharge of the lead frame unit and the downward displacement of the gear racks 226 so as to ensure the opening movement of the holding bars 218. This reciprocal drive device 225 includes a press block 228 which is disposed generally above the holding bars 218, this press block 228 having a push plate 229 secured to the underside thereof. The push plate 229 has its lower surface disposed closely adjacent and directly above the lead frame B as supported on the holding bars 218. The press block 228 has the lower end of a piston rod 231 anchored thereto, which piston rod is vertically reciprocally controlled by and projects downwardly from a fluid pressure cylinder 234, the latter being mounted on a support plate 233 which is secured to and straddles the support rails 201. The press block 228 has a pair of parallel and upwardly projecting guide rods 235 fixed thereto, the latter being slidably and guidably supported within bushings mounted on the support plate 233.

The press block 228 defines the lower horizontally extending leg of a Z-shaped member 238, the upper horizontal leg of which is positioned upwardly above the support rails 201 and has a pair of parallel guide bars 239 supported thereon and projecting transversely therethrough. These guide bars 239 in turn support thereon a pair of sidewardly spaced guide blocks 240. Each of these guide blocks 240 in turn supports thereon one of the gear racks 226 for vertical displacement.

As illustrated by FIG. 18, each of the gear racks 226 has an upper end portion thereof interconnected to the respective guide block 240, with the gear rack 226 projecting downwardly therefrom and slidably guided through a support block 221 which is fixed to the respective guide rail 204. The gear rack 226 is also supported for vertical slidable displacement within the respective guide block 240, and for this purpose the upper end portion 242 of the gear rack 226 has a compression spring 243 which surrounds same and coacts between the guide block 240 and a cap 244 as fixed to the free end of the gear rack. This spring 243 normally urges the gear rack 226 upwardly relative to the guide block 240 into an uppermost limit position wherein an upwardly facing shoulder 241 on the gear rack abuts the underside of the guide block 240.

Considering now the storage or receiving means 295 for the lead frame units, same includes the cassette 273 which is positioned directly under the holding bars 218 and is adapted to receive and store a vertically arranged stack of lead frame units therein. To control the build-up of lead frame units within the cassette 273, there is provided a vertical slide 27-, which controls the vertical lowering of the stack within the cassette. This slide 277 is spaced sidewardly from the cassette and has a pair of bars 278 projecting sidewardly therefrom and engaged with a loading or elevator plate 269 which is disposed within the cassette and is adapted to engage the lowermost lead frame unit. The slide 277 is slidably guided on a pair of parallel and vertically projecting guide rods 275 which are secured to a stationary base plate 274. The slide 277 is also threadably engaged with a vertically projecting threaded rod 276, the latter being rotatably supported on the base plate 274 and coupled to a drive pulley 279. The latter is engaged through a belt 282 and drive pulley 281 with a motor 280 so as to permit rotation of the shaft 276. The motor 280 drives the threaded rod 276 so as to effect incremental vertical lowering of slide 277, and of loading plate 269, so that the stack of lead frame units within the cassette 273 is vertically and sequentially lowered as the stack builds up. Thus, the uppermost cassette which is discharged from the holding bars 218 will drop only a small distance onto the top of the stack.

Summarizing now the operation of the delivery device 290, the finished lead frame unit is discharged from the blasting chamber into engagement with the opposed reaches of the belts 252 and 255 which transport the lead frame unit forwardly. After termination of the top drive belt 252, the bottom drive belts 255 continue to drive the lead frame unit forwardly, same being held down due to the presence of the top plate 258. The belts 255 continue to drive the lead frame unit forwardly into engagement with the shoulders 205 of the guide rails 204 and, after passing the pusher bar 261, the latter is moved downwardly a small extent by activation of the pressure cylinder 267, and then the pusher bar moves forwardly by activation of the motor 272 so that the pusher bar engages the upstream or rearward end of the lead frame unit and continues to move it forwardly with substantially the same speed along the guide shoulders 205 until the lead frame unit is moved onto the shoulders 227 of the holding bars 218. At this time the motion of the pusher bar is reversed and it returns to its initial position and awaits the next incoming lead frame unit.

Thereafter, cylinder 234 is activated so that the press block 228 and push plate 229 move downwardly so as to substantially engage the lead frame B as supported on the holding bars 218. Simultaneously, however, the downward movement of press block 228 and its member 238 causes the guide blocks 240 to move down, and hence drive the racks 226 downwardly, and they in turn act through the gears so as to swingably move the holding bars 218 into their open position, whereby the lead frame unit is deposited into the cassette 273. The slide 277 associated with the cassette is vertically moved downwardly in a steplike manner by increments equal to the height of the lead frame unit so as to control the build-up of the stack.

The arrangement and operation of this delivery device permits efficient and substantially automated handling of the lead frame units, and the transferring thereof, without scarring or damaging the lead frame units, and without causing distortion thereof. Further, the transfer occurs into the cassette solely by linear movements so that not only is the handling of the lead frame unit simplified, but the operation time can be significantly shortened. In addition, the apparatus permits the width or interval between the guide plates to be readily adjusted so as to accommodate lead frame units of different width.

Although a particular preferred embodiment of the invention has been disclosed in detail for illustrative purposes, it will be recognized that variations or modifications of the disclosed apparatus, including the rearrangement of parts, lie within the scope of the present invention.

The embodiments of the invention in which an exclusive property or privilege is claimed are defined as follows:

1. A lead frame handling apparatus for a blasting machine, comprising:

blasting means including a housing defining therein a blasting chamber, the housing having inlet and outlet openings which are spaced horizontally adjacent opposite ends of the housing, and conveying means associated with the housing for individually supporting and continuously moving a lead frame through the blasting chamber from the inlet opening to the outlet opening so as to subject the lead frame to a blasting media within the blasting chamber, the conveying means effecting movement of the lead frame along a generally horizontally extending line;

inlet guide rail means stationarily disposed adjacent the inlet opening of said housing for slidable displacement of a said lead frame generally horizontally therealong substantially in alignment with said line, said inlet guide rail means including a pair of sidewardly spaced stationary inlet guide rails defining parallel and horizontally extended guide surfaces in sidewardly spaced relationship for supportingly engaging opposite sides of the lead frame;

inlet conveyor means for effecting engagement of the lead frame supported on said inlet guide rails for effecting continuous slidable movement therealong for transferring the lead frame into engagement with the conveying means;

inlet holding means for engaging a said led frame at a location disposed upstream of and substantially aligned with said inlet rail means, said inlet holding means including a pair of opposed movable holding members which are movable between release and supporting positions, said holding members when in said supporting position having a pair of generally parallel support surfaces thereon which supportingly engage opposite sides of the lead frame, said support surfaces being aligned with the guide surfaces of said inlet guide rails;

supply means disposed below said inlet holding means for advancing a said lead frame vertically upwardly into a predtermined position wherein the lead frame is disposed in said holding position for engagement by said inlet holding means;

intermittent advancing means for engaging the lead frame supported on said inlet holding means and slidably horizontatally advancing it along said support surfaces onto the guide surfaces of said inlet rails;

outlet guide rail means stationarily disposed adjacent the outlet opening of said housing for slidable displacement of a said lead frame generally horizontally therealong substantially in alignment with said line, said outlet guide rail means including a pair of sidewardly spaced stationary outlet guide rails defining parallel and horizontally extended guide surfaces in sidewardly spaced relationship for supportingly engaging opposite sides of the lead frame;

outlet holding means located downstream of said outlet guide rails for supporting thereon a said lead frame and for discharging it downwardly, said outlet holding means including a pair of movable outlet holding members which are movable in opposition to one another between release and supporting positions, said outlet holding members having horizontally elongated and generally parallel supporting surfaces which when in the holding position are aligned with the guide surfaces on the outlet rails for supporting opposite sides of the lead frame;

forwarding means associated with said outlet rail means for engaging the lead frame discharged from the blasting means and for slidably advancing the lead frame forwardly along the guide surfaces of the outlet guide rails onto the support surfaces of the outlet holding members;

receiving means disposed below said outlet holding members for receiving the lead frame which is discharged from the holding members when the latter are moved into said release position; and activating means for effecting movement of said outlet holding members into said release position so as to permit downward discharge of said lead frame.

2. An adjustable guideway arrangement for transporting of individual lead frame units, comprising:

a pair of stationary supports disposed in sidewardly spaced relationship, said supports being fixedly interconnected to a machine frame;

a pair of horizontally elongated and substantially parallel guide rail structures disposed in sidewardly spaced relationship between said pair of supports, said pair of guide rail structures defining a longitudinally elongated space therebetween;

a plurality of horizontally elongated guide spindles mounted on and extending transversely between said supports in generally parallel relationship with respect to one another, one of said spindles being disposed adajacent one end of said guide rail structures, and another of said spindles being disposed adjacent the other end of said guide rail structures;

linear ball-slide arrangements cooperating between said guide rail structures and said spindles for slidably supporting the guide rail structures on the spindles for transverse movement of the guide rail structures relative to the supports;

adjustment means extending transversely between said supports and drivingly engaged with said guide rail structures for adjusting the transverse spacing between said guide rail structures, said adjustment means including a single rotatable adjustment shaft rotatably supported on and extending transversly between said supports and having oppositely threaded portions respectively threadably engaged with said side rail structures for causing the pair of side rail structures to be simultaneously and synchronously moved either outwardly away from or inwardly toward one another depending on the direction of rotation of the adjustment shaft, said adjustment shaft being located generally between said one spindle and said another spindle relative to the longitudinal directon of the guide rail structures;

said guide rail structures each having a horizontally elongated guide surface formed thereon and extending in the longitudinal direction thereof, each said guide surface being defined by a substantially upwardly facing shoulder, the guide surface on each said guide rail structure being disposed on an inner face thereof so that the guide surfaces of said pair of guide rail structures are parallel and disposdd substantially directly opposite one another to permit a lead frame unit to be disposed in straddling relationship between the guide rail structures with the opposite edges of the lead frame unit being supported on the guide surfaces; and driving means having a dirving element which projects into the space between said guide rail structures and is linearly movable longitudinally along said space for engaging a rearward edge of the lead frame unit for lineraly displacing the lead frame unit along the guide rail structures.

3. An arrnagement according to claim 2, including motor means connected to end of said adjustment shaft for effecting rotation thereof in a selected direction, and measuring means connected to the other end of said adjustment shaft for measuring the rotation thereof and determining the postion of the guide rail structures.

4. An apparatus for guiding and transporting lead frame units along a substantially horizontally extending centerline, comprising:

a machine frame having sidewardly spaced supports;
a pair of horizontally elongated and approximately parallel rail structures disposed in sidewardly spaced relationship, said rail structures being positioned adjacent said pair of supports, said rail structures having a longitudinally elongated space therebetween which defines said centerline and along which the lead frme units are sequentially horizontally transported;

means adjustably supporting said pair of rail structures for adjusting the transverse spacing therebetween so that the rail structures can be simultaneously and synchronously moved either outwardly away from or inwardly toward said centerline to adjust said spacing in accordance with the width of the lead.frame unit;

said rail structures including adjacent at least one end thereof horizontally elongated guide rails extending generally parallel with and on opposite sides of said centerline, each said guide rail defining thereon a longitudinally elongated guide surface which is disposed on an inner face of the respective guide rail and includes a substantially upwardly facing shoulder, the guide surfaces on said-guide rails extending generally parallel and in straddling relationship on opposite sides of the centerline so as to permit opposite edges of the lead frame unit to be slidably supported thereon;

holding means disposed adjacent one end of said guide rails for slidably supporting a said lead frame unit thereon, said holding means including a pair of holding members which are respectively movably supported on said pair of rail structures, said pair of holding members defining a pair of support surfaces which are generally horizontally elongated and extend generally parallel to and on opposed sides of said centerline, said support surfaces including a generally upwardly facing shoulder sp that said lead frame unit can be disposed in straddling relationship to the holding members with the opposite edges thereof supported on said support surfaces;

said holding members being movably supported relative to said pair of rail structures for movement between a support position and a release position, said holding members when in said support position being disposed so that said support surfaces are substantially horizontally aligned with said guide surfaces, said holding members when in said release position being disposed with said support surfaces transversely spaced apart by a distance greater than the width of the lead frame unit;

cassette means for supporting therein a plurality of said lead frame units in a vertical stack, said cassette means being positioned under said holding means; and transfer means for effecting substantially linear vertical transfer of a said lead frame unit between said cassette means and said holding means, said transfer means including (1) drive means for controlling movement of said holding members between said release and support positions and (2) vertically movable elevator means associated with said cassette means and having the stack of lead frame units supported thereabove for controlling the vertical position of said stack.

5. An apparatus according to claim 4, wherein said pair of holding members are respectively slidably supported on said pair of rail structures for substantially linear displacement between said support and release positions, said holding members being slidably displaceable in a direction generally perpendicular with respect to said centerline, the movement of said holding members from said support position to said release position increasing the horizontal spacing between said support surfaces.

6. An apparatus according to claim 5, including a linearly reciprocal conveying member for engaging a rearward edge of the lead frame unit supported on said holding members when the latter are in said support position for linearly slidably advancing the lead frame unit along said support surfaces onto said guide surfaces, and conveying means for engaging the lead frame unit supported on said guide surfaces for linearly slidably advancing the lead frame unit forwardly along said guide surfaces.

7. An apparatus according to claim 4, wherein said holding members are pivotally supported on the respective horizontally in generally parallel relationship with said centerline, said holding members being simultaneouly swingable in opposite rotational directions for causing the support surfaces to be simultaneously moved outwardly away from one another and tranversely away from said centerline as said holding members are moved from said support position toward said release position.

8. An apparatus according to claim 7, wherein said drive means includes first and second driving members which are coupled together for synchronous vertical displacement, said first drive member being drivingly coupled to said holding members to effect pivoting thereof into said holding position in response to downward vertical displacement of said first driving member, said second driving member being disposed directly above the lead frame unit supported on the holding members to effect positive downward discharge of the lead frame unit into the cassette means when the holding members move into said release position.

9. An apparatus according to claim 4, including a top plate structure disposed between said rail structures substantially directly over said holding members and extending longitudinally therealong, said top plate being disposed closely adjacent and substantially directly over the support surfaces when the holding members are in said support position so that the lead frame unit is vertically confined between the support surface and the top plate.

10. An apparatus according to claim 9, wherein said elevator means includes a drive which lifts the stack vertically upwardly so that the uppermost lead frame of the stack is moved upwardly between the holding members when in the release position so as to be pressed aganist the top plate to remove distortion from the lead frame unit, said drive means then causing the holding members to return to the support position to engage opposite edges of the uppermost lead frame unit and said drive thereafter effecting lowering of said elevator means and of the remaining stack of lead frame units supported thereon.

11. An apparatus according to claim 10, including a reciporocal pushing member disposed for engagement with a rear edge of the lead frame unit for linearly slidably advancing same along said centerline from beneath said top plate onto said guide surfaces.

12. An apparatus for handling and transporting lead frame units, comprising:
supply means supporting therein a vertical stack of lead frame units;
lifting means associated with said supply means for effecting vertical lifting of said stack so that the uppermost lead frame unit in the stack is disposed at a predetermined location;
holding means disposed for supportingly engaging the uppermost lead frame unit when disposed in said predetermined location, said holding means including a pair of holding members positioned on opposite sides of said predetermined location and mounted for movement between release and holding positions, said holding members being simultaneously movable inwardly toward one another from said release position to said holding position so as to supportingly engage opposite side edge of the lead frame unit disposed in said predetermined location so as to supportingly separate it from the stack;
said holding members defining thereon parallel and substantially horizontally elongated support surfaces which supportingly engage opposite side edges of the lead frame unit, said support surfaces defining a longitudinal direction along which the lead frame unit is slidably moved;
guide means extending generally parallel with said longitudinal direction for slidably and supportingly guiding the lead frame thereon for movement along said longitudinal direction, said guide means including a pair of guide rails disposed in generally opposed relationship on opposite sides of said longitudinal direction, said guide rails defining thereon a pair of generally parallel and horizontally extending guide surfaces which are respectively aligned with the support surfaces on the holding members when the latter are in said holding position;
advancing drive means for engaging the lead frame unit supported on said holding means and for linearly slidably advancing it from said holding members onto said guide rails; and
top plate means stationarily disposed substantially between said holding members directly above said supply means fir defining thereon a lower abutment surface against which the uppermost lead frame unit is pressed when being moved into said predetermined location.

13. An apparatus according to claim 12, including a pair of horizontally elongated and generally parallel rail structures disposed generally parallel with and in straddling relationship with respect to said longitudinal direction, said guide rails being fixedly secured to the respective rail structures, and said holding members being movably supported on the respective rail structures and
means operatively and drivingly connected between said pair of rail structures for synchronously and simultaneously movably displacing said rail structures either inwardly toward or outwardly away from one another to vary the tranverse spacing between said support and guide surfaces.

14. An apparatus for handling and transporting lead frames, comprising:
holding means disposed for supportingly engaging a lead frame unit in a predetermined location, said holding means including a pair of holding members positioned on opposite sides of said predetermined location and mounted for movement between release and holding positions, said holding members being simultaneously movable outwardly away from one another from said holding position to said release position so as to disengage opposite sides of the lead frame unit and permit it to be discharged downwardly;
receiver means disposed bleow said holding means for supporting therein a verticall stack of lead frame units;
lowering means associated with said receiver means for effecting vertical lowering ofsaid stack so that the uppermost lead frame unit in the stack is disposed slightly below said holding means said holding members defining thereon parallel and substatnially horizontally elongated support surfaces which supprtingly engage opposite sides of the lead frame unit, said support surfaces defining a longitudinal direction along which the lead frame unit is slidably moved;

guide means extending generally parallel with said longitudinal direction for slidably and supportingly guiding the lead frame unit thereon for movement along said longitudinal direction, said guide means including a pair of guide rails disposed in generally opposed relationship on opposite sides of said longitudianl direction, said guide rails defining thereon a pair of generally parallel and horizontally extending guide surfaces which are respectively aligned with the support surfaces on the holding members when the latter are in said holding position; and advancing means for engaging the lead frame unit supported on said guide rails and for linearly slidably advancing it from said guide rails onto said holding members.

15. An apparatus according to claim 14, including a pair of horizontally elongated and generally parallel rail structures disposed generally parallel with and in straddling relationship with respect to said longitudinal direction, said guide rails being fixedly secured to the respective rail structures, and said holding members being movably supported on the respective rail structures; and means operatively and drivingly connected between said pair of rail structures for synchronously and simultaneously movably displacing said rail structures either inwardly toward or outwardly away from one another to vary the transverse spacing between said support and guide surfaces.

16. An apparatus according to claim 14, including driving means for effecting movement of the holding members from the holding position to the release postion so as to permit discharge of the lead frame unit therefrom for downward vertical movement thereof into the receiver means, said driving means including a gear rack which is vertically slidably movable and engaged with a pinion which is drivingly coupled to the holding member for rotation of the latter between said release and holding positions, said driving means including motor means connected to said gerar rack for controlling the vertical displacement thereof, and a pusher member suppprted for supported for vertical displacement and having a part thereof dispossed directly over the lead frame unit wicn is supported on said holding members to assist in positive discharge of the lead frame unit downwardly when the holding members are moved into said release.position saidJpushing. member being interconnected to said gear rack for simultanceous vertical displacement therewith.

* * * * *

UNITED STATES PATENT AND TRADEMARK OFFICE
CERTIFICATE OF CORRECTION

PATENT NO. : 4 674 238

DATED : June 23, 1987

INVENTOR(S) : Akira SUZUKI et al

It is certified that error appears in the above-identified patent and that said Letters Patent is hereby corrected as shown below:

Column 15, line 36; change "posdd" to ---posed---.

Column 15, line 41; change "dirving" to ---driving---.

Column 15, line 47; change "arrnagement" to ---arrangement---.

Column 15, line 48; before "end" insert ---one---.

Column 15, line 63; change "frme" to ---frame---.

Column 17, line 8; after "tive" insert ---rail structures for swinging movement about axes which extend---.

Column 17, line 50; change "reciporocal" to ---reciprocal---.

Column 18, line 31; change "fir" to ---for---.

Column 18, line 42; after "tures" insert ---;---.

Column 18, line 62; change "bleow" to ---below---.

UNITED STATES PATENT AND TRADEMARK OFFICE
CERTIFICATE OF CORRECTION

PATENT NO. : 4 674 238

DATED : June 23, 1987

INVENTOR(S) : Akira SUZUKI et al

It is certified that error appears in the above-identified patent and that said Letters Patent is hereby corrected as shown below:

Column 18, line 66; change "ofsaid" to ---of said---.

Column 19, line 2; change "substatnially" to

---substantially---.

Column 19, line 3; change "supprtingly" to ---supportingly---.

Column 19, line 13; change "gitudianl" to ---gitudinal---.

Column 20, line 19; change "gerar" to ---gear---.

Column 20, line 21; delete "supported for" (first occurrence).

Column 20, line 22; change "dispossed" to ---disposed---.

Column 20, line 23; change "wicn" to ---which---.

Column 20, line 26; change "release.position saidJpushing." to

---release position, said pushing---.

Column 20, line 28; change "ceous" to ---eous---.

Signed and Sealed this

Fifteenth Day of March, 1988

Attest:

DONALD J. QUIGG

Attesting Officer

Commissioner of Patents and Trademarks